United States Patent [19]
Inoue

[11] Patent Number: 5,892,657
[45] Date of Patent: Apr. 6, 1999

[54] ELECTRONIC-CIRCUIT ASSEMBLY AND ITS MANUFACTURING METHOD

[75] Inventor: Tatsuo Inoue, Tokyo, Japan

[73] Assignee: NEC Corporation, Tokyo, Japan

[21] Appl. No.: 816,671

[22] Filed: Mar. 13, 1997

[30] Foreign Application Priority Data

Mar. 13, 1996 [JP] Japan .................................. 8-055683

[51] Int. Cl.⁶ .................................................. H05K 7/20
[52] U.S. Cl. ...................... 361/704; 361/688; 361/705; 361/707; 361/718; 361/719; 361/749; 257/700; 257/706; 257/707; 165/80.2; 165/80.3
[58] Field of Search .................................... 361/704, 688, 361/748, 749, 760, 767, 778, 790, 792; 257/700, 706, 707; 174/52.1, 52.4, 262, 264; 165/80.2, 80.3

[56] References Cited

U.S. PATENT DOCUMENTS

| | | | |
|---|---|---|---|
| 5,128,831 | 7/1992 | Fox, III et al. | 361/735 |
| 5,384,955 | 1/1995 | Booth et al. | 29/830 |

FOREIGN PATENT DOCUMENTS

| | | |
|---|---|---|
| 0 561 620 A2 | 9/1993 | European Pat. Off. . |
| 2724 052 A | 3/1996 | France . |
| WO 93/13637 | 8/1993 | WIPO . |

OTHER PUBLICATIONS

Akihiro et al., "Packaging Technology for the NEC SX–3/SX–X Supercomputer", Proceedings of the Electronic Components and Technology Conference, Las Vegas, May 20–23, 1990, vol. 1, pp. 525–533.

Tummala et al., Microelectronics Packaging Handbook, 1989, pp. 462–464.

*Primary Examiner*—Lynn D. Feild
*Assistant Examiner*—Boris L. Cheruinsky
*Attorney, Agent, or Firm*—Foley & Lardner

[57] ABSTRACT

An electronic-circuit assembly of the present invention comprises a plurality of film carriers which are stacked. Respective film carriers have a plurality of through-holes. One of through-holes is provided on corresponding position to another through-hole in the stacked direction of the substrate. Two of adjacent film carriers are connected by the corresponding through-holes. A connection member is provided in two of adjacent through-holes in the stacked direction of the substrates. A connection state between film carriers can be easily checked. Since it is visually checked that solder appears inside the topmost through-hole. Furthermore, wiring lengths for connection between substrates can be reduced. Since the plurality of substrates are three-dimensionally connected.

14 Claims, 6 Drawing Sheets

ELECTRONIC-CIRCUIT ASSEMBLY AND ITS MANUFACTURING METHOD

BACKGROUND OF THE INVENTION

The present invention relates to an electronic-circuit assembly, and more particularly to an electronic asemmbly having a plurality of substrates which are stacked.

An example of such a conventional electronic-circuit assembly having a laminate made of a plurality of substrates is described in a document disclosed in Rao R. Tummala and Eugene J. Rymaszewski, "Microelectronics Packaging Handbook", 1989, Van Nostrand Reinhold, New York, pp.462–464.

Referring to FIG. 7—7 of the reference, two ceramic substrates are stacked in this technique. These ceramic substrates are connected to each other by soldering pins protruding from a lower surface of an upper substrate to an upper surface of a lower substrate.

This prior art, however, has a problem that is described below.

First, it is hard to check a connection state between the substrates. This is because the connected portion is covered with the upper substrate.

Next, it takes a long time for a design change. This is because it requires a longer time to change a design of the ceramic substrates than that of flexible substrates such as tape automated bonding (TAB) tape. Specifically, it takes a few months for a design change of the ceramic substrates, while it takes a few days for a design change of the TAB tape. Particularly, it requires a long time to change processes of a mask for an internal circuit or a screen therefor.

SUMMARY OF THE INVENTION

In view of the aforementioned problems of the prior art, one object of the present invention is to provide a mounting structure of electronic parts whose connection state between substrates is easily checked.

Another object of the present invention is to provide a mounting structure of electronic parts whose design can be changed in a short time.

Yet another object of the present invention is to provide a method of reducing a length of connection wire between electronic parts.

According to the present invention, an electronic-circuit assembly comprises a plurality of stacked substrates having through-holes respectively and a connection member having electric conductivity and connecting adjacent through-holes of said substrates to each other in the stack direction of said substrates.

In another aspect of the present invention, the electronic-circuit assembly may further comprising a wiring substrate, said wiring substrate including a first surface on which said plurality of substrates are mounted, and terminals provided on said first surface and connected to said through-holes in the lowest one of said plurality of substrates by said connection member.

In yet another aspect of the present invention, the electronic-circuit assembly, wherein said plurality of substrates includes conductive pads which are provided on upper and lower surfaces of said substrates, surround said through-holes, and are connected to said through-holes of said substrate and wherein connections between said plurality of substrates are made by connecting said conductive pads to each other by said connection member in said plurality of substrates.

BRIEF DESCRIPTION OF THE DRAWINGS

Other features and advantages of the invention will be made more apparent by the detailed description hereunder taken in conjunction with the accompanying drawings, wherein.

In the drawings, the same reference numerals represent the same structural elements.

DETAILED DESCRIPTION OF THE PREFERRED EMBODIMENTS

Figure 1:
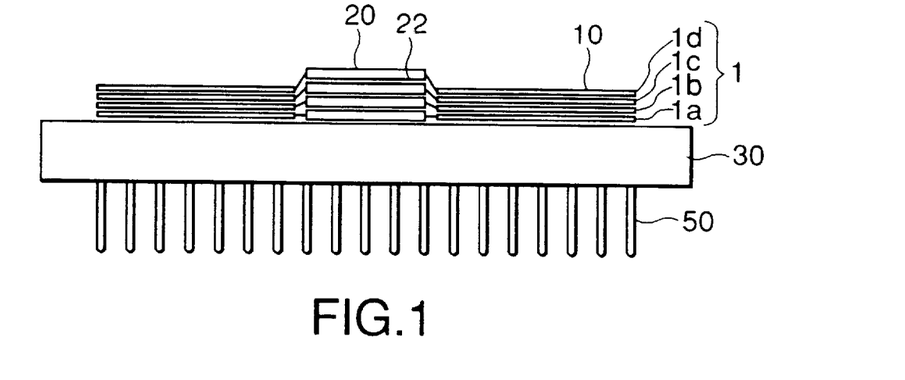
FIG. 1 is a drawing illustrating a structure of a first embodiment of the present invention.

This invention will be described below by using the accompanying drawings. Referring to FIG. 1, a first embodiment of an electronic-circuit assembly of the present invention includes a wiring substrate 30 and a plurality of film carriers 1 mounted on the wiring substrate 30. Although FIG. 1 shows four layers of film carriers 1a to 1d, the number of the layers for the film carriers 1 is not limited. The film carriers 1a, 1b, 1c and 1d are stacked. Adjacent two of the film carriers 1 in the stack direction are connected to each other in a connection structure described below. At the center of each of film carriers 1, an LSI chip 20 is mounted. On a circuit surface of the LSI chip 20 is coated with plastic mold resin 22. Between adjacent two of the LSI chips 20 in the stack direction, heating plates, which are not shown, are provided. The heating plates are formed of good thermal conductivity materials such as copper-tungsten alloy. On a lower surface of the wiring substrate 30, a plurality of input-output pins 50 are provided.

Figure 2:
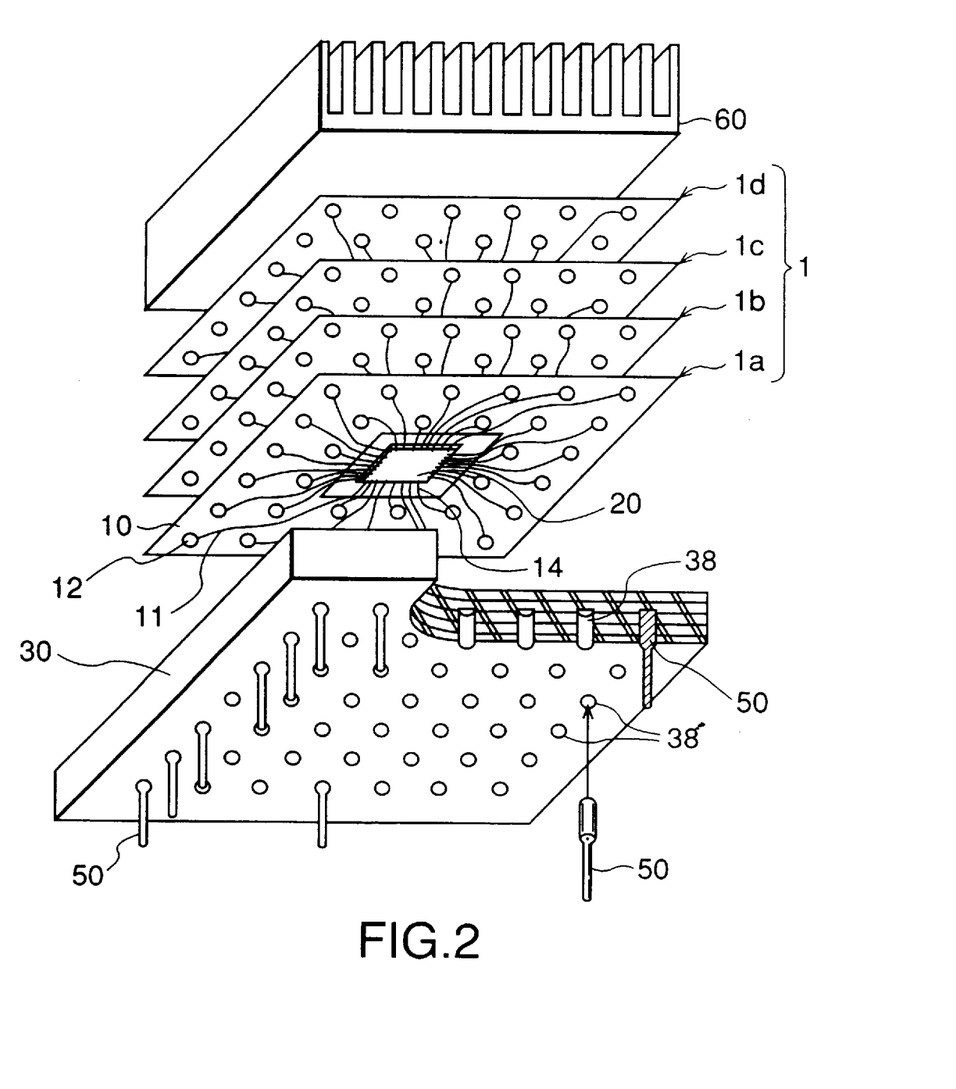
FIG. 2 is an exploded view illustrating a structure of the first embodiment of the present invention.
Figure 3:
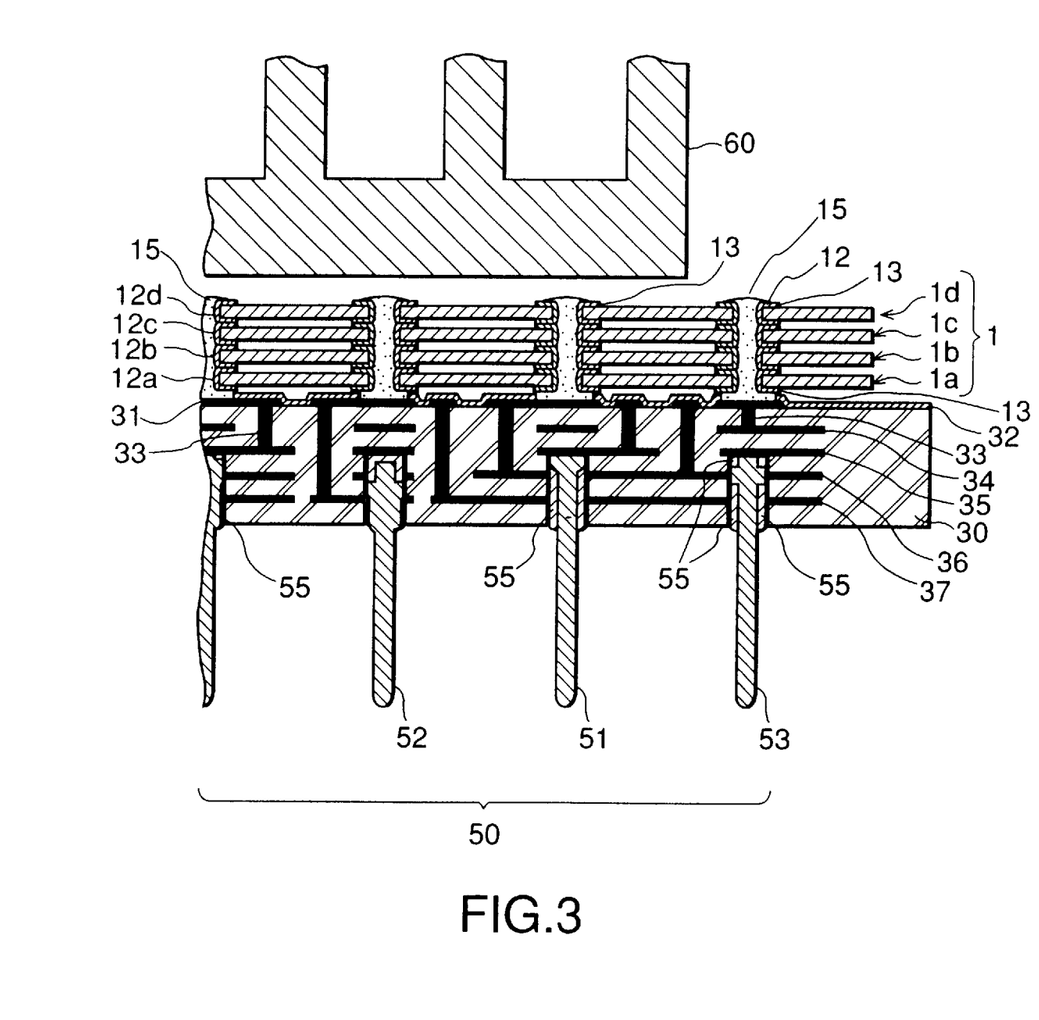
FIG. 3 is a drawing illustrating a detailed structure of the first embodiment of the present invention.

Referring to FIGS. 2 and 3, each of film carriers 1 includes a flexible film 10. The flexible film 10 is made of insulating materials such as polyimide or epoxy resin. The flexible film 10 has pliability and has a form of a square having each side of approximately 50 mm. The thickness of the flexible film 10 is approximately 50 µm.

In the central portion of the flexible film 10, a device hole for containing the LSI chip 20 is provided. In the outside of the device hole, a plurality of through-holes 12 are arranged in a lattice. Each distance in the lattice is approximately 1.27 mm. A diameter of each through-hole 12 is approximately 100 µm. Around the through-hole 12 and on the inner surface thereof, lands 13 of conductive materials are provided. A diameter of each land 13 is approximately 300 µm.

On the flexible film 10, a circuit pattern 11 is provided. A wire width of the circuit pattern 11 is approximately 50 µm. The circuit pattern 11 connects the plurality of through-holes 12 and a plurality of beam leads 14 respectively. Ends of the circuit pattern 11 are connected to through-holes 12. The other ends of the circuit pattern 11 are connected respectively to one end of a beam lead 14 on a circumferential edge of the device hole. The other ends of the beam leads 14, which protrude to an inside the device hole, are connected to a pad of the LSI chip 20.

For manufacturing the film carriers 1 and mounting the LSI chips 20, a tape automated bonding (TAB) technique can be used. Details of the TAB techniques are described in, for example, in a document written by Rao R. Tummala and Eugene J. Rymaszewski "Microelectronics Packaging Handbook" 1989, Van Nostrand Reinhold, New York, pp. 409 to pp. 454. A film carrier 1 produced by using the TAB technique is called a TAB tape carrier.

Materials of the wiring substrate 30 are epoxy resin or polyimide reinforced with glass fiber. The wiring substrate 30 has a shape of a square having each side of approximately 60 mm. The wiring substrate 30 has a thickness of approximately 2.5 mm and high rigidity. The wiring substrate 30 is a multi-layer wiring substrate. Ground circuit layers 34 and 36 and power supply source circuit layers 35 and 37 are provided in the inside of the wiring substrate 30.

On the upper surface of the wiring substrate 30, a plurality of pads 31 are provided. The pads 31 are arranged in positions corresponding to the through-holes 12 of the film carriers 1. In other words, the pads 31 are arranged in a lattice. Each distance of the lattice is approximately 1.27 mm. Areas, where the pads 31 are not provided, on the upper surface of the wiring substrate 30 are coated with solder resist 32.

On the lower surface of the wiring substrate 30, a plurality of input-output pins 50 are provided. The input-output pins 50 are arranged in a lattice. Each distance of the lattice is approximately 1.27 mm. When the electronic-circuit assembly is mounted on a mother board, the input-output pins 50 are connected to the mother board. The length of the wiring between the LSI chips and the mother board can be reduced to the minimum by using the input-output pins 50 provided directly under the LSI chips 20 or around them. Since the input-output pins 50 are arranged on the entire lower surface of the wiring substrate 30.

Referring to FIG. 3, respective ends of the input-output pins 50 are inserted into respective hole portions 38 on the wiring substrate 30. Inserted portions of respective input-output pins 50 are coated with insulating coating 55. When removing a part of the insulating coating 55 to expose conductive portions, the input-output pins 50 are selectively connected to the internal circuit layers of the wiring substrate 30. According to the removed portions of the insulating coating 55, there are provided three types of input-output pins 51 to 53. The input-output pin 51 has a removed portion at the top of the insulating coating 55. Therefore, the input-output pin 51 is connected to the power supply source circuit layer 35. The input-output pin 52 has a removed portion in the lower part of the insulating coating 55. Therefore, the input-output pin 52 is connected to the power supply source circuit layer 37. The input-output pin 53 has a removed portion in the middle part of the insulating coating 55. Therefore, the input-output pin 53 is connected to the ground circuit layer 36. In this manner, the internal circuit layers of the wiring substrate 30 can be selectively connected to the input-output pins 50. In addition, the wiring substrate 30 has through-holes for signal pins. Pins are inserted into the through-holes for the signal pins without insulating coating.

Referring to FIGS. 2 and 3, a heat sink 60 for heat dissipation is installed on the LSI chip 20 which is mounted on the topmost film carrier 1d.

Next, a connection structure between the film carriers 1a to 1d is described below.

Referring to FIG. 3, the through-holes 12a to 12d of the film carriers 1a to 1d are positioned in a straight line on the pad 31 on the wiring substrate 30. The through-holes 12a to 12d are connected by solder 15. The through-holes 12a to 12d are filled with the solder 15.

Figure 4:
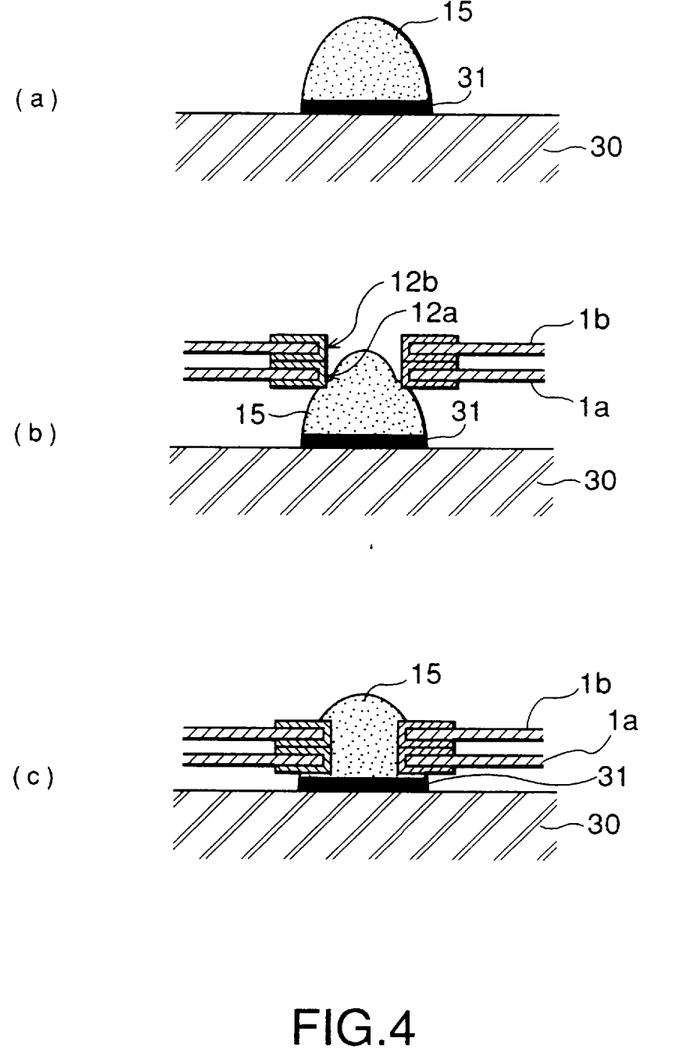
FIG. 4 is a drawing illustrating a manufacturing method of the first embodiment of the present invention.

A manufacturing method of the mounting structure of this embodiment is described below by using the accompanying drawing. Specifically, a description will be made of a method of stacking the film carriers 1a and 1b on the wiring substrate 30. In this stacking method, a plurality of film carriers 1 are connected at a time.

Referring to FIG. 4(a), the solder 15 is positioned on the pad 31 of the wiring substrate 30 in a first step. For example, printing is made with creamy solder 15 on the pad 31.

Referring to FIG. 4(b), the stacked film carriers 1a and 1b are positioned on the solder 15 in a second step.

Referring to FIG. 4(c), the solder 15 is heated in a third step. The solder 15 melts and a part of it is sucked inside the through-holes 12a and 12b. After that, the solder 15 is cooled down so as to connect the pad 31 with the through-holes 12a and 12b.

Figure 5:
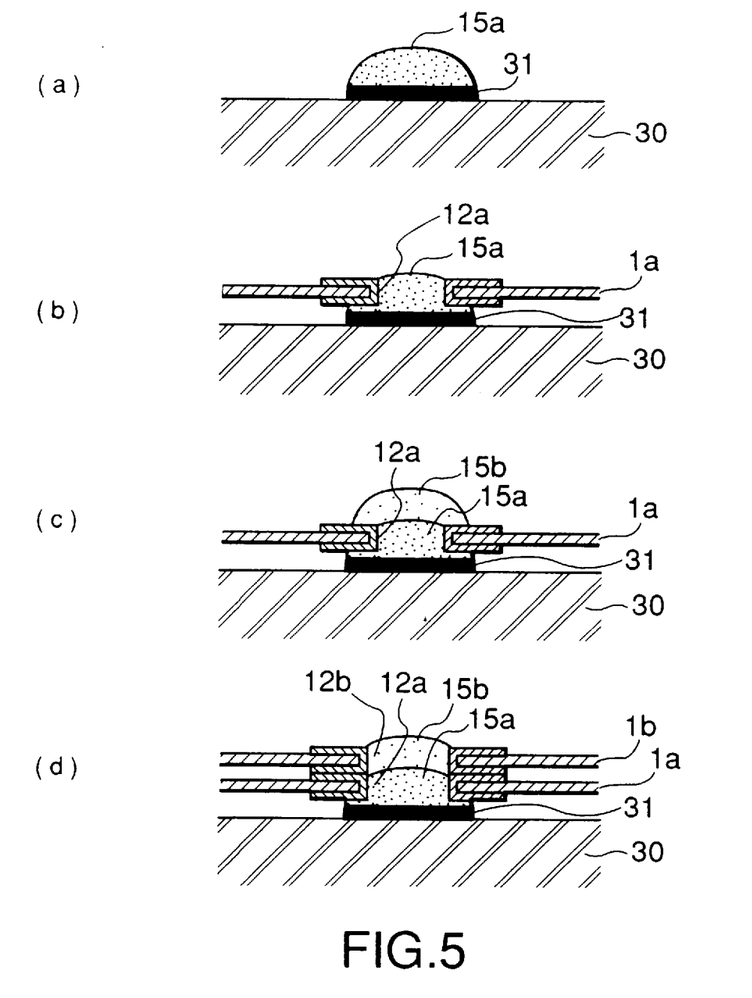
FIG. 5 is a drawing illustrating another manufacturing method of the first embodiment of the present invention.

Subsequently, another stacking method is described below. In this stacking method, the film carriers 1 are stacked sequentially.

Referring to FIG. 5(a), solder 15a is positioned on the pad 31 in a first step.

Referring to FIG. 5(b), a through-hole 12a of a film carrier 1a is connected to the pad 31 in the same manner as for FIGS. 4(b) and 4(c) in a second step.

Referring to FIG. 5(c), solder 15b is positioned on the solder 15a in a third step. A melting point of the solder 15b is lower than that of the solder 15a.

Referring to FIG. 5(d), a through-hole 12b of a film carrier 1b is connected to the through-hole 12a in the same manner as for FIGS. 4(b) and 4(c) in a fourth step. A heating temperature of the solder 15b is lower than the melting point of the solder 15a. Therefore, the solder 15a does not melt in the fourth step.

In the above manufacturing method, the connection state between the through-holes 12a and 12b can be easily checked. Specifically, it is only required to check that the solder 15 appears inside the topmost through-hole 12b. It can be checked only with viewing the film carrier 1b from the upward position.

In the first embodiment, assuming that the LSI chip 20 has each side of 20 mm, that the LSI chip 20, the heat conductive plate, and the plastic mold resin have a height of 1 mm in total, that the LSI chips 20 are stacked at 2-mm intervals, that the film carrier 1 has each side of 50 mm, and that four LSI chips 20 are mounted on a single film carrier 1, 16 LSI chips 20 are arranged within a region of a quadrangular prism having each side of 40 mm and a height of 4 mm. A circuit region of the LSI chips 20 has a form of a quadrangular prism having each side of 50 mm and a height of 4 mm. Therefore, when the LSI chips 20 are connected to each other by means of three-dimensional orthogonal-system circuit, the wire between the farthest LSI chips 20 has a length of 104 mm or less.

On the other hand, if the above-described 16 LSI chips 20 are mounted on a substrate of a single layer, a mounting area of the LSI chips 20 has a form of a square having each side of 80 mm. In this structure, the wire for connection between the LSI chips 20 spaced farthest to each other has a length of approximately 160 mm. In this manner, the length of the wire between the LSI chips 20 can be reduced according to the present invention.

Figure 6:
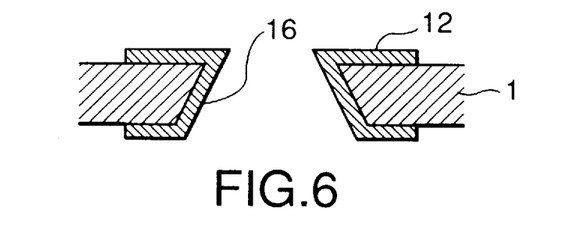
FIG. 6 is a drawing illustrating a structure of a through-hole 12 of a second embodiment of the present invention.

Next, a second embodiment of the present invention is described below by using the accompanying drawings. The second embodiment is characterized by a structure of through-holes 12. Other structures are essentially the same as for the first embodiment.

Referring to FIG. 6, each of the through-holes 12 of the second embodiment has a tapered inner surface.

Figure 7:
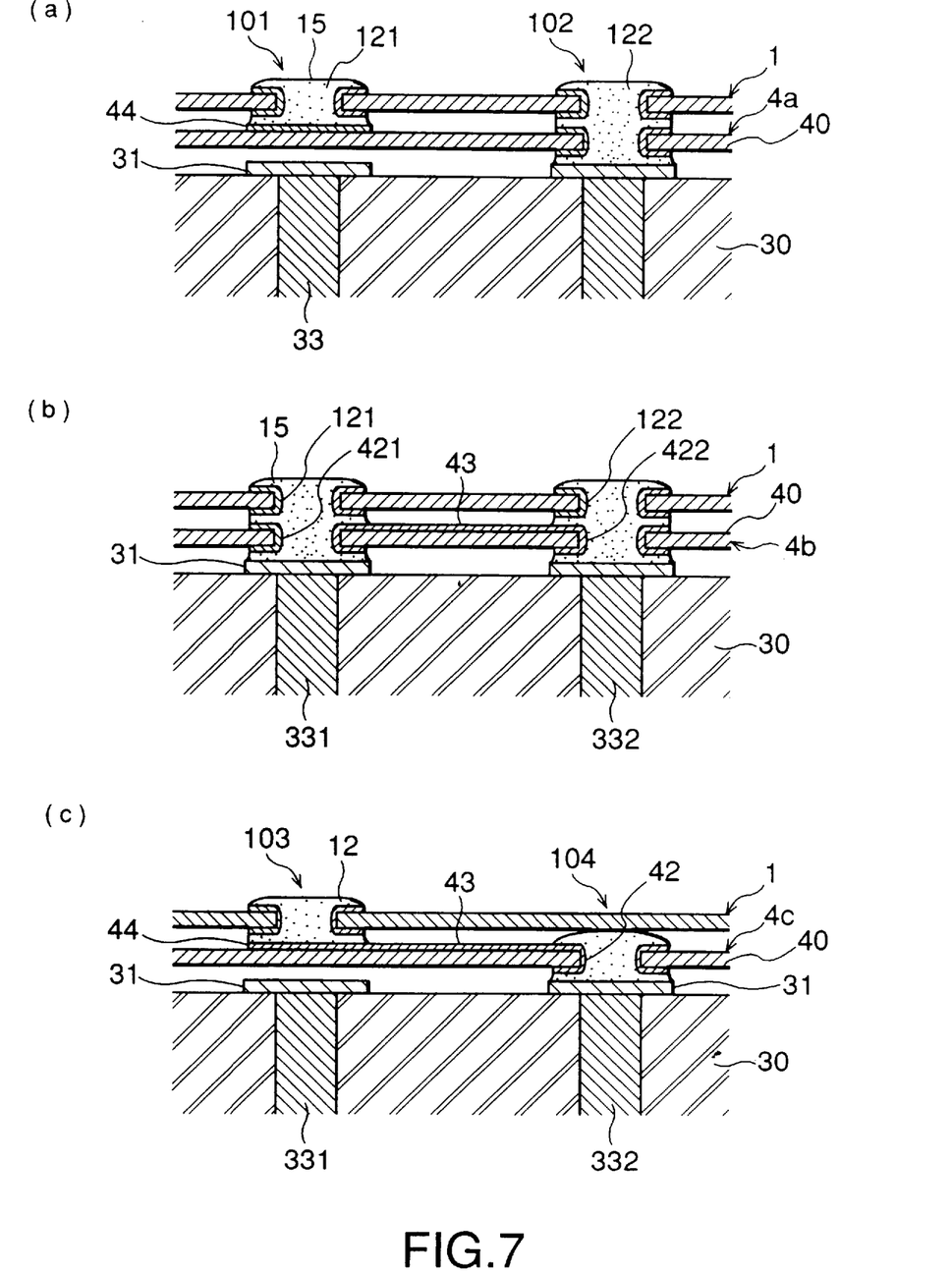
FIG. 7 is a drawing illustrating a structure of a design change film carrier 4 of a third embodiment of the present invention.

Next, a third embodiment of the present invention is described below by using the accompanying drawings. The third embodiment of the present invention is characterized by a point that it includes a design change film carrier so as to simplify the design changes. Other structures are essentially the same as for the first embodiment. On the design change film carrier, a disconnection means, a connection means, and a switching means are appropriately arranged so as to achieve a desired design change by a combination of these means.

Referring to FIG. 7(a), the disconnection means for a design change film carrier 4a is achieved by means of not providing a through-hole. A film carrier 1 has a through-hole 121 at a lattice point 101. On the other hand, the design change film carrier 4a does not have any through-hole at the lattice point 101 so as to have an insulation between an upper surface of the design change film carrier 4a and a lower surface thereof. At the lattice point 101 on the upper surface of the design change film carrier 4a, a land 44 is arranged instead of a through-hole. The land 44 is connected to a through-hole 121 of the film carrier 1 by means of solder. In this manner, a signal through-hole 33 is electrically disconnected from the through-hole 121. The material, size and a shape of a flexible film 40 of the design change film carrier 4 may be the same as for the flexible film 10.

Referring to FIG. 7(b), a connection means of a design change film carrier 4b is achieved by a circuit pattern 43 arranged on the design change film carrier 4b. The circuit pattern 43 connects a through-hole 421 of the design change film carrier 4b to a through-hole 422 therefor. By this connection, a signal through-hole 331 is connected to a signal through-hole 332.

Referring to FIG. 7(c), a switching means for a design change film carrier 4c is achieved by a combination between the disconnection means and the connection means. The film carrier 1 has a through-hole 12 at a lattice point 103. The design change film carrier 4c does not have any through-hole at the lattice point 103. Therefore, the through-hole 12 is electrically disconnected from a signal through-hole 331. At the lattice point 103 on an upper surface of the design change film carrier 4c, a land 44 is provided instead of a through-hole. The land 44 is connected to a through-hole 42 via a circuit pattern 43. A through-hole 42 is positioned at a lattice point 104 which is different from the point of the through-hole 12. The through-hole 42 is connected to the signal through-hole 332. In this manner, the through-hole 12 which would have been originally connected to the signal through-hole 331 can be switched to the signal through-hole 332.

With combinations of the switching means, the connection means, and the disconnection means, various design changes can be achieved. The design change film carrier 4 can be made in a shorter time in comparison with a multilayer wiring substrate. Accordingly, a design for an electronic-circuit assembly can be changed in a short time. At present, the design change film carrier 4 can be made in two or three days.

According to this embodiment, respective film carriers are connected to each other only by means of soldering between lands arranged around through-holes on upper and lower surfaces of respective film carriers. Accordingly, the design change film carrier 4 can be inserted by melting the solder to separate respective film carriers 12. In addition, the design change film carrier 4 can be made in a short time.

In this embodiment, the design change film carrier 4 is arranged between the wiring substrate 30 and the lowest film carrier 1. It is, however, possible to arrange the design change film carrier 4 in other positions between layers. In addition, it is also possible to use a plurality of design change film carriers 4.

Next, a fourth embodiment of the present invention is described below by using the drawings.

Figure 8:
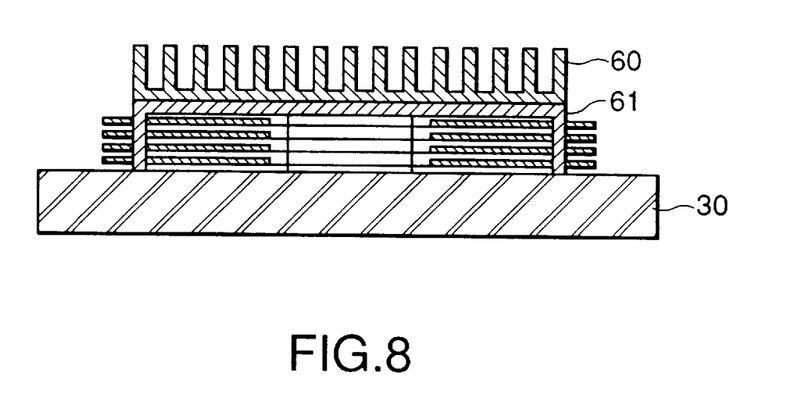
FIG. 8 is a drawing illustrating a structure of a fourth embodiment of the present invention.

Referring to FIG. 8, this embodiment is characterized by a supporting member 61 for supporting the heat sink 60. Other structures are essentially the same as for the first embodiment.

The supporting member 61 has a pillar-shaped foot portion and a plate portion arranged on the foot portion. The foot portion of the supporting member 61 is inserted into holes on the flexible film 10 so as to be fixed to the wiring substrate 30. At this point, the LSI chip 20 of the topmost film carrier 1 is brought into a contact with a lower surface of the plate portion of the supporting member 61. The plate portion has holes for containing the topmost through-holes 12. These holes prevent electric contacts between the through-holes 12 and the plate portions. The heat sink 60 is installed on the upper surface of the supporting member 61.

A gap between adjacent flexible films 10 can be filled with resin. In addition, a gap between the supporting member 61 and the topmost flexible film 10 can be filled with resin. It is preferable that the resin has both good insulation quality and good heat conductivity.

In this structure, heat generated from each LSI chip 20 is conducted to the topmost LSI chip 20 via a heat conductive plate arranged between the LSI chips 20. The heat conducted to the topmost LSI chip 20 is conducted to the heat sink 60 via a plate portion of the supporting member 61. The heat conducted to the heat sink 60 is discharged to the outside air.

In the fourth embodiment, the heat sink 60 is supported by the supporting member 61 and therefore the weight of the heat sink 60 is not distributed to the LSI chips 20. Accordingly, reliability of the LSI chips 20 is not reduced when a large-sized heat sink 60 is used. In addition, the foot portion of the supporting member 61 serves as a guide of the film carriers 1.

Subsequently, another embodiment of the present invention is described below.

A plurality of LSI chips 20 can be mounted on a single film carrier 1. Additionally, it is also possible to combine the above-described characteristics of respective embodiments.

As described above, the LSI chips 20 are mounted on the film carriers 1 and a plurality of the film carriers 1 are stacked into a stack in the present invention. The film carriers 1 are connected by soldering the through-holes 12 arranged on the film carriers 1. A design change can be achieved by putting the design change film carrier 4 between the film carriers 1. This electronic-circuit assembly has the following effects.

First, a connection state between the film carriers 1 can be easily checked. Specifically, it is only required to check visually that solder appears inside the topmost through-hole 12.

Second, a design can be changed in a short time. Specifically, it is only required to insert a design change film carrier 4. The design change film carrier 4 can be made in a short time.

Third, wiring lengths for connection between electronic parts can be reduced. This is because the electronic parts are three-dimensionally mounted.

While this invention has been described in conjunction with the preferred embodiments thereof, it will now readily be possible for those skilled in the art to put this invention into practice in various other manners.

What is claimed is:

1. An electronic-circuit assembly comprising:
    a plurality of stacked substrates, wherein each of said substrates has a plurality of through-holes, respectively;
    at least one connection member that is electrically conductive and for connecting adjacent through-holes of said substrates to each other in a stack direction of said substrates;
    a wiring substrate including a first surface on which said substrates are mounted, and having terminals provided on said first surface; and
    a design change substrate within said substrates and said wiring substrate, wherein said design chance substrate has through-holes opposed and connected by associated connection members to only associated ones of said terminals, and
    wherein said design change substrate has no through-holes opposed to unassociated ones of said terminals, whereby said unassociated ones of said terminals are unconnected to said through-holes of said substrates.

2. The electronic-circuit assembly as claimed in claim 1, wherein said plurality of substrates includes conductive pads which are provided on upper and lower surfaces of said substrates, surround said through-holes, and are connected to said through-holes of said substrate; and
    wherein connections between said plurality of substrates are made by connecting said conductive pads to each other by said connection member in said plurality of substrates.

3. The electronic-circuit assembly as claimed in claim 1, further comprising an integrated circuit chip mounted on at least one of said plurality of substrates.

4. The electronic-circuit assembly as claimed in claim 1, wherein said through-holes are arranged in a lattice in each of said plurality of substrates.

5. The electronic-circuit assembly as claimed in claim 1, wherein at least one of said plurality of said substrates is an insulating substrate which has no through-holes at positions corresponding to said connected adjacent through-holes of said substrates.

6. The electronic-circuit assembly as claimed in claim 1, wherein at least one of said plurality of substrates is a connection substrate having a first through-hole, a second through-hole, and a circuit connecting between said first through-hole and said second through-hole.

7. The electronic-circuit assembly as claimed in claim 1, wherein said plurality of substrates comprises:
    a first substrate having a first through-hole and a connection member provided in the first through-hole; and
    a second substrate having a terminal provided at a position corresponding to said first through-hole of said first substrate and connected to said connection member provided in the first through-hole, a circuit connected to said terminal, and a second through-hole connected to said circuit.

8. The electronic-circuit assembly as claimed in claim 1, further comprising:
    an integrated circuit chip mounted at least on the topmost substrate out of said plurality of substrates;
    a heat dissipation member thermally connected to said integrated circuit chip; and
    a supporting means for supporting said heat dissipation member on said wiring substrate.

9. The electronic-circuit assembly as claimed in claim 1, wherein said through-holes have a tapered inner surface.

10. The electronic-circuit assembly as claimed in claim 1, wherein each of said plurality of substrates has flexibility.

11. The electronic-circuit assembly as claimed in claim 1, wherein said connection member is solder.

12. An electronic-circuit assembly as claimed in claim 1, wherein said design change substrate further comprises a land that is opposite one of said connected, adjacent through-holes of said substrates, and wherein said land is connected to said connected, adjacent through-holes of said substrates.

13. An electronic-circuit assembly as claimed in claim 1, further comprising a connection member that electrically connects plural through-holes of said design change substrate and electrically connects said associated ones of said terminals.

14. An electronic-circuit assembly comprising a plurality of stacked substrates, each having a plurality of through-holes, respectively, and connection members for electrically connecting adjacent through-holes of said stacked substrates to each other in a stack direction of said substrates, a wiring substrate having a first surface on which said stacked substrates are positioned and having a plurality of terminals provided on said first surface; and
    a design change substrate interposed in said stacked substrates and said wiring substrate, said design change substrate further comprising:
    through-holes that are connected to adjacent ones of said connected, adjacent through-holes of said stacked substrates; and
    means for electrically connecting only predetermined ones of said terminals to predetermined ones of said connected, adjacent through-holes of said stacked substrates.

* * * * *